United States Patent
Ko

(10) Patent No.: US 9,660,155 B2
(45) Date of Patent: May 23, 2017

(54) LIGHT EMITTING DIODE

(71) Applicant: LG CHEM, LTD., Seoul (KR)

(72) Inventor: Min Jin Ko, Daejeon (KR)

(73) Assignee: LG CHEM, LTD., Seoul (KR)

( * ) Notice: Subject to any disclaimer, the term of this patent is extended or adjusted under 35 U.S.C. 154(b) by 0 days.

(21) Appl. No.: 14/648,145

(22) PCT Filed: Nov. 28, 2013

(86) PCT No.: PCT/KR2013/010927
§ 371 (c)(1),
(2) Date: May 28, 2015

(87) PCT Pub. No.: WO2014/084639
PCT Pub. Date: Jun. 5, 2014

(65) Prior Publication Data
US 2015/0303358 A1 Oct. 22, 2015

(30) Foreign Application Priority Data
Nov. 28, 2012 (KR) .................. 10-2012-0136497
Nov. 28, 2013 (KR) .................. 10-2013-0146199

(51) Int. Cl.
*H01L 33/00* (2010.01)
*H01L 33/56* (2010.01)
(Continued)

(52) U.S. Cl.
CPC .............. *H01L 33/56* (2013.01); *H01L 33/50* (2013.01); *H01L 33/501* (2013.01);
(Continued)

(58) Field of Classification Search
CPC ..... H01L 33/50; H01L 33/501; H01L 33/504; H01L 33/507; H01L 33/54; H01L 33/56;
(Continued)

(56) References Cited

U.S. PATENT DOCUMENTS

2006/0099449 A1  5/2006  Amano et al.
2007/0287208 A1  12/2007  Thompson et al.
(Continued)

FOREIGN PATENT DOCUMENTS

CN  101208811 A  6/2008
CN  101443924 A  5/2009
(Continued)

OTHER PUBLICATIONS

International Search Report issued in International Application No. PCT/KR2013/010927 on Mar. 24, 2014, 2 pages.
(Continued)

*Primary Examiner* — Victor A Mandala
*Assistant Examiner* — Colleen E Snow
(74) *Attorney, Agent, or Firm* — Rothwell, Figg, Ernst & Manbeck, P.C.

(57) ABSTRACT

Provided are a light emitting diode, a method of manufacturing the same, and a use thereof. The light emitting diode having excellent initial light flux and excellent color uniformity and dispersion, the method of manufacturing the same, and the use thereof may be provided.

12 Claims, 1 Drawing Sheet

(51) Int. Cl.
*H01L 33/50* (2010.01)
*H01L 33/54* (2010.01)

(52) U.S. Cl.
CPC ............ *H01L 33/507* (2013.01); *H01L 33/54* (2013.01); *H01L 33/504* (2013.01); *H01L 2933/005* (2013.01); *H01L 2933/0041* (2013.01); *H01L 2933/0091* (2013.01)

(58) Field of Classification Search
CPC ....... H01L 2933/005; H01L 2933/0041; H01L 2933/0091
USPC .................. 257/98, 102, 103; 438/29, 45
See application file for complete search history.

(56) References Cited

U.S. PATENT DOCUMENTS

| | | | |
|---|---|---|---|
| 2009/0045422 A1* | 2/2009 | Kato | C09D 183/04 257/98 |
| 2010/0109034 A1 | 5/2010 | Bierhuizen et al. | |
| 2013/0026500 A1* | 1/2013 | Kim | H01L 33/50 257/88 |
| 2013/0187176 A1 | 7/2013 | Ko et al. | |
| 2013/0221379 A1* | 8/2013 | Saito | H01L 31/167 257/82 |

FOREIGN PATENT DOCUMENTS

| | | |
|---|---|---|
| CN | 102130236 A | 7/2011 |
| CN | 102712756 A | 10/2012 |
| EP | 2530104 A2 | 12/2012 |
| JP | 2004-262952 A | 9/2004 |
| JP | 2005-105217 A | 4/2005 |
| JP | 2007-008996 A | 1/2007 |
| JP | 2010-251621 A | 11/2010 |
| JP | 2011-071404 A | 4/2011 |
| JP | 2011-233552 A | 11/2011 |
| JP | 2012-009470 A | 1/2012 |
| JP | 2012-015175 A | 1/2012 |
| JP | 2012-049022 A | 3/2012 |
| JP | 2012-227516 A | 11/2012 |
| KR | 10-2006-0066773 A | 6/2006 |
| KR | 10-2010-0080455 A | 7/2010 |
| KR | 10-2011-0061421 A | 6/2011 |
| KR | 10-2012-0017703 A | 2/2012 |
| KR | 10-1114922 B1 | 2/2012 |
| KR | 10-2012-0024510 A | 3/2012 |
| KR | 10-2012-0030871 A | 3/2012 |

OTHER PUBLICATIONS

Extended European Search Report dated May 31, 2016, issued in European Patent Application No. 13859163.1, 7 pages.
Office Action issued for Chinese Patent Application No. 201380061962.1 dated Sep. 29, 2016, 8 pages.

* cited by examiner

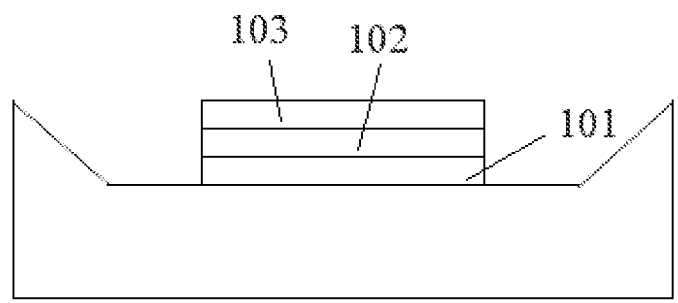

LIGHT EMITTING DIODE

CROSS REFERENCE TO RELATED APPLICATIONS

This application is a 35 U.S.C. §371 National Phase Entry Application from PCT/KR2013/010927, filed Nov. 28, 2013, and designating the United States, which claims priority under 35 U.S.C. §119 to Korean Patent Application No. 10-2012-0136497 filed Nov. 28, 2012 and to Korean Patent Application No. 10-2013-0146199 filed Nov. 28, 2013, which are incorporated herein by reference in their entireties.

BACKGROUND

1. Field of the Invention

The present invention relates to a light emitting diode, a method of manufacturing the same, and a use thereof.

2. Discussion of Related Art

A light emitting diode (hereinafter, simply referred to as a "LED") is considered to be applied as, for example, a light or display due to low energy consumption. As a blue or UV LED having a wavelength of approximately 250 nm to 550 nm, a high-brightness product using a GaN-series compound semiconductor such as GaN, GaAlN, InGaN, and InAlGaN is obtained, and a structure of an LED package capable of exhibiting high emission is suggested, for example, in Korean Patent Application Publication NO. 2006-0066773.

SUMMARY OF THE INVENTION

The present invention is directed to providing an LED, a method of manufacturing the same, and a use thereof.

One aspect of the present invention provides an exemplary LED, which includes an LED chip, a first silicone film layer (hereinafter, simply referred to as a "first film layer") and a second silicone film layer (hereinafter, simply referred to as a "second film layer"). For example, as shown in FIG. 1, the LED may sequentially include an LED chip 101, a first silicone film layer 102 present on the LED chip 101, and a second silicone film layer 103 present on the first film layer 102. Here, the first silicone film layer 102 may be in contact with the LED chip 101, and the second silicone film layer 103 may be in contact with the first film layer 102.

Hereinafter, unless particularly defined otherwise, a refractive index may refer to a refractive index measured with respect to light with a wavelength of approximately 400 nm.

A kind of the LED chip included in the LED is not particularly limited, and a known chip may be used. For example, an LED chip formed by stacking a semiconductor material on a substrate may be used, and as the semiconductor material, GaAs, GaP, GaAlAs, GaAsP, AlGaInP, GaN, InN, AlN, InGaAlN, or SiC may be used, but the present invention is not limited thereto.

An emission wavelength of the LED chip may be, for example, 250 nm to 550 nm, 300 nm to 500 nm, or 330 nm to 470 nm. The emission wavelength may refer to a main emission peak wavelength. When the emission wavelength of the LED chip is set within the above-described range, a white LED having a longer lifespan, high energy efficiency, and high color gamut may be obtained.

In one example, the first and second film layers may have different refractive indexes, and the first film layer may have a higher refractive index than the second film layer. As will be described below, when the second film layer includes a phosphor, in the comparison of refractive indexes between the first and second film layers, the refractive index of the second film layer may be a refractive index when including the phosphor, or a refractive index when excluding the phosphor.

For example, the first film layer may have a refractive index measured with respect to light with a wavelength of 400 nm of 1.50 or more or 1.55 or more. In addition, the upper limit of the refractive index of the first film layer is not particularly limited, and the refractive index of the first film layer may be determined within a range of, for example, approximately 1.7 or less, 1.65 or less, or 1.6 or less.

The second film layer may have a refractive index measured with respect to light with a wavelength of 400 nm of 1.6 or less, less than 1.6, or 1.55 or less. For example, when the second film layer includes a phosphor as will be described below, the refractive index of the second film layer may be a refractive index measured with respect to the second film layer excluding the phosphor. The lower limit of the refractive index of the second film layer is not particularly limited, and the refractive index of the second film layer may be determined within a range of, for example, approximately 1.3 or more, 1.35 or more, 1.4 or more, or 1.45 or more.

In a structure of the LED, for example, the first and second film layers may have a thickness within a range from 1 μm to 300 μm, respectively. For example, the first film layer may have a thickness of approximately 1 μm to 250 μm, 1 μm to 200 μm, 1 μm to 150 μm, 1 μm to 100 μm, or 1 μm to 50 μm. In addition, the second film layer may have a thickness of approximately 10 μm to 300 μm, 20 μm to 300 μm, 30 μm to 300 μm, 40 μm to 300 μm, 50 μm to 300 μm, 55 μm to 300 μm, 55 μm to 250 μm, 55 μm to 200 μm, or 55 μm to 150 μm. Within the above ranges, excellent color uniformity and color dispersion may be exhibited along with a high initial light flux.

The first and second film layers may be silicone film layers including a silicone resin, respectively.

For example, the first and/or second film layer(s) may be formed by curing a composition including an organopolysiloxane (A) including at least two aliphatic unsaturated bonds and an organopolysiloxane (B) including a hydrogen atom binding to a silicon atom.

Here, as the organopolysiloxane (A), for example, an organopolysiloxane having an average unit of Formula 1 may be used.

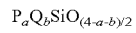  [Formula 1]

$$P_a Q_b SiO_{(4-a-b)/2}$$

In Formula 1, P is an alkenyl group, Q is an epoxy group or a monovalent hydrocarbon group, and a and b are number such that a+b is 0.8 to 2.2 or 1 to 2.2 and a/(a+b) is 0.001 to 0.15.

In the specification, the sentence "the organopolysiloxane has a predetermined average unit" means that the organopolysiloxane is formed of a single component having a predetermined average unit, or a mixture of at least two components and having an average composition of each component in the mixture, which is represented by a predetermined average unit. Accordingly, the organopolysiloxane (A) is a linear, branched, or crosslinked single organopolysiloxane having an average unit of Formula 1, or a mixture of at least two thereof.

The term "monovalent hydrocarbon group" used herein may refer to a monovalent residue derived from an organic compound consisting of carbon and hydrogen or a derivative thereof. The monovalent hydrocarbon group of Formula 1 includes at least two carbons, and in another example, may include 2 to 25 carbon atoms. As the monovalent hydrocarbon group, for example, an alkyl group, an alkenyl group, or an aryl group may be used.

The term "alkoxy group" used herein may refer to, unless particularly defined otherwise, an alkoxy group having 1 to 20, 1 to 16, 1 to 12, 1 to 8, or 1 to 4 carbon atoms. The alkoxy group may have a linear, branched, or cyclic structure, and may be optionally substituted with at least one substituent.

Unless particularly defined otherwise, the term "alkyl group" used herein may refer to an alkyl group having 1 to 20, 1 to 16, 1 to 12, 1 to 8, or 1 to 4 carbon atoms. The alkyl group may have a linear, branched, or cyclic structure, and may be optionally substituted with at least one substituent.

The term "alkenyl group" used herein may be, unless particularly defined otherwise, an alkenyl group having 2 to 20, 2 to 16, 2 to 12, 2 to 8, or 2 to 4 carbon atoms. The alkenyl group may have a linear, branched, or cyclic structure, and may be optionally substituted with at least one substituent.

The term "aryl group" used herein may refer to, unless particularly defined otherwise, a monovalent residue derived from a compound including a benzene ring or a structure in which at least two benzene rings are connected or condensed, or from a derivative thereof. That is, in the range of the aryl group, an aralkyl group or arylalkyl group, in addition to aryl groups conventionally referred to as an aryl group, may also be included. The aryl group may be an aryl group having, for example, 6 to 25, 6 to 21, 6 to 18, or 6 to 13 carbon atoms. The aryl group may be a phenyl group, a dichlorophenyl group, a chlorophenyl group, a phenylethyl group, a phenylpropyl group, a benzyl group, a tolyl group, a xylyl group, or a naphthyl group, and preferably, a phenyl group.

The term "epoxy group" used herein may refer to, unless specifically defined otherwise, a monovalent residue induced from cyclic ether having three ring-forming atoms, or a compound including the cyclic ether. The epoxy group may be a glycidyl group, an epoxyalkyl group, a glycidoxyalkyl group, or an alicyclic epoxy group. The alicyclic epoxy group may refer to a monovalent residue having an aliphatic hydrocarbon ring structure and derived from a compound including a structure in which two carbon atoms forming the aliphatic hydrocarbon ring also form an epoxy group. The alicyclic epoxy group may be an alicyclic epoxy group having 6 to 12 carbon atoms, for example, a 3,4-epoxycyclohexylethyl group.

In the specification, a substituent capable of being optionally substituted to a monovalent hydrocarbon group, an alkyl group, an alkenyl group, an alkoxy group, an epoxy group, or an aryl group may be, but is not limited to, a halogen, an epoxy group, an acryloyl group, a methacryloyl group, an isocyanate group, a thiol group, or the above-described monovalent hydrocarbon group.

In Formula 1, P is an alkenyl group, and may perform an addition and curing reaction with a hydrogen atom of an organopolysiloxane including a hydrogen atom, which will be described below. In one example, the alkenyl group may be present in a molar ratio (Ak/Si) of the alkenyl group (Ak) with respect to total silicon atoms (Si) included in the organopolysiloxane of Formula 1 of 0.05 to 0.4 or 0.1 to 0.35. As the molar ratio (Ak/Si) is controlled to 0.05 or more and 0.4 or less, an LED may stably ensure reliability even when driven for a long time.

In one example, the organopolysiloxane (A) may include at least one aryl group binding to a silicon atom, and thus at least one of Q of Formula 1 may be an aryl group. In an exemplary organopolysiloxane, a molar ratio (Ar/Si) of the aryl group (Ar) with respect to total silicon atoms (Si) may be 0.3 or more, 0.35 or more, or 0.4 or more. In the above range, long-term reliability and brightness of the LED device may be stably ensured. The upper limit of the molar ratio (Ar/Si) may be, but is not particularly limited to, for example, 1.2 or 1.5.

In one example, the organopolysiloxane (A) or the organopolysiloxane of Formula 1 may have a viscosity at 25° C. of 2,000 cP or more, 3,000 cP or more, 4,000 cP or more, 5,000 cP or more, 7,000 cP or more, 9,000 cP or more, or 9,500 cP or more. In such a range, processability and hardness of the polysiloxane may be suitably maintained. Meanwhile, the upper limit of the viscosity may be, but is not particularly limited to, for example, 100,000 cP or less, 90,000 cP or less, 80,000 cP or less, 70,000 cP or less, or 65,000 cP or less.

In one example, the organopolysiloxane (A) or the organopolysiloxane of Formula 1 may have a weight average molecular weight (Mw) of 1,500 or more, 2,000 or more, 3,000 or more, 4,000 or more, or 5,000 or more. The term "weight average molecular weight" refers to a conversion value with respect to standard polystyrene measured by gel permeation chromatography (GPC). In addition, unless particularly defined otherwise, the term "molecular weight" may refer to a weight average molecular weight. In the above range, moldability, hardness, and strength of the polysiloxane may be suitably maintained. Meanwhile, the upper limit of the molecular weight may be, but is not particularly limited to, for example, 14,000 or less, 12,000 or less, or 10,000 or less.

For example, the organopolysiloxane (A) or the organopolysiloxane of the average unit of Formula 1 may include an organopolysiloxane having an average empirical formula of Formula 2.

$$(R^3{}_3SiO_{1/2})_a(R^2{}_2SiO_{2/2})_b(R^1SiO_{3/2})_c(SiO_{4/2})_d \quad \text{[Formula 2]}$$

In Formula 2, $R^1$ and $R^2$ are each independently an alkoxy group, a hydroxyl group, an epoxy group, or a monovalent hydrocarbon group, $R^3$ is an alkyl group, an alkenyl group, or an aryl group, at least one of $R^1$ to $R^3$ is an alkenyl group, at least one of $R^1$ to $R^3$ is an aryl group, the sum (a+b+c+d) of a, b, c, and d is 1, a is a number of 0 to 0.5, b is a number of more than 0 to 0.8, c is a number of more than 0 to 0.8, and d is a number of 0 to 0.2.

In one example, the organopolysiloxane having the average empirical formula of Formula 2 may include an alkenyl group, an aryl group, and/or an epoxy group as described above, and a ratio of each group may be determined within a range satisfying the above-described molar ratio.

The organopolysiloxane (A) or the organopolysiloxane of the average unit of Formula 1 may include, for example, an organopolysiloxane having an average empirical formula of Formula 3.

$$(R^1R^2{}_2SiO_{1/2})_a(R^3R^4SiO_{2/2})_b(R^5SiO_{3/2})_c \quad \text{[Formula 3]}$$

In Formula 3, $R^1$ is an alkyl group having 1 to 4 carbon atoms, $R^2$ is a monovalent hydrocarbon group having at least two carbon atoms, $R^3$ and $R^4$ are each independently an alkyl group having 1 to 20 carbon atoms, an alkenyl group having 2 to 20 carbon atoms, or an aryl group having 6 to 25 carbon atoms, $R^5$ is an alkyl group having 1 to 20 carbon atoms or an aryl group having 6 to 25 carbon atoms, at least one of $R^2$, $R^3$, and $R^4$ is an alkenyl group, and when a+b+c is set to 1, a is 0.01 to 0.10, b is 0 to 0.99, c is 0.01 to 0.30, b/a is 5 or more, b/c is 5 or more.

When the definition of the monovalent hydrocarbon group is applied to the monovalent hydrocarbon group having at least two carbon atoms of Formula 1, the lower limit of the carbon number of the monovalent hydrocarbon group may be 2.

In the average empirical formula of Formula 3, the alkyl group having 1 to 4 carbon atoms may be a linear, branched, or cyclic alkyl group. The alkyl group may be optionally substituted by at least one substituent. In the average empirical formula of Formula 1, $R^2$ may be a methyl group.

In the average empirical formula of Formula 3, in another example, the aryl group having 6 to 25 carbon atoms may be an aryl group having 6 to 21, 6 to 18, or 6 to 13 carbon atoms, and may be optionally substituted with at least one substituent. The aryl group may be, for example, a phenyl group, a tolyl group, a xylyl group or a naphthyl group, and preferably a phenyl group.

In the average empirical formula of Formula 3, in another example, the alkyl group having 1 to 20 carbon atoms may be an alkyl group having 1 to 16, 1 to 12, 1 to 8, or 1 to 4 carbon atoms. The alkyl group may have a linear, branched, or cyclic structure, and may be optionally substituted with at least one substituent.

In the average empirical formula of Formula 3, in another example, the alkenyl group having 2 to 20 carbon atoms may be an alkenyl group having 2 to 16, 2 to 12, 2 to 8, or 2 to 4 carbon atoms. The alkenyl group may have a linear, branched, or cyclic structure, and may be optionally substituted with at least one substituent.

In Formula 3, at least one of $R^2$, $R^3$, and $R^4$ may be an alkenyl group. In one example, the alkenyl group may be present at a molar ratio (Ak/Si) of the alkenyl group (Ak) with respect to total silicon atoms (Si) included in the compound (A) of 0.001 to 0.1 or 0.005 to 0.1. In the above-described range, reactivity of the component with another component may be suitably maintained, leakage of non-reactive components from a surface of a cured product may be prevented, and crack resistance of the cured product may be excellently maintained.

In the average empirical formula of Formula 3, a, b, and c refer to molar ratios of respective siloxane units, and when the sum (a+b+c) thereof is set to 1, a is 0.01 to 0.10, b is 0 to 0.99, and c is 0.01 to 0.30.

The organopolysiloxane represented by the average empirical formula of Formula 3 may include an M unit which is, so called, a monofunctional siloxane unit conventionally represented as $(R_3SiO_{1/2})$ in the art, a D unit which is, so called, a bifunctional siloxane unit represented as $(R_2SiO_{2/2})$ in the art, and a T unit which is, so called, a trifunctional siloxane unit represented as $(RSiO_{3/2})$ in the art.

In one example, the polysiloxane of Formula 3 may have a structure including a structure derived from the T unit (hereinafter, referred to as a "crosslinked structure") and a sufficiently long linear structure derived from the D unit. The exemplary polysiloxane may have a b/c of 5, 7, 8, or 10 or more in the average empirical formula of Formula 1. In addition, in the average empirical formula, b/a may be 5 or more, 8 or more, or 10 or more. Here, the upper limit of the b/c is not particularly limited, and may be, for example, 70, 60, 50, or 40. In addition, the upper limit of the b/a is not particularly limited, and may be, for example, 110, 100, 90, 80, 70, or 60. In the specification, the polysiloxane having the above-described ratio of the polysiloxane unit may be called a polysiloxane having a combination crosslinked structure. When the polysiloxane has the above-described structure, suitable physical properties may be exhibited according to application.

In one example, at least one aryl group binding to a silicon atom of the organopolysiloxane having the average empirical formula of Formula 3 may be bound to a silicon atom of the D unit. That is, the exemplary polysiloxane may include at least one aryl group binding to the silicon atom of the D unit, and a molar ratio (Ar-D/Si) of the aryl group binding to the silicon atom of the D unit (Ar-D) with respect to total silicon atoms (Si) of the polysiloxane may be 0.3 or more, 0.35 or more, or 0.4 or more. In one example, the upper limit of the molar ratio (Ar-D/Si) may be, but is not particularly limited to, for example, 1.2 or 1.5.

In another example, at least one aryl group binding to a silicon atom of the organopolysiloxane having the average empirical formula of Formula 3 may be bound to a silicon atom of a T unit.

In one example, the organopolysiloxane having the average empirical formula of Formula 3 may be an organopolysiloxane having an average empirical formula of Formula 4.

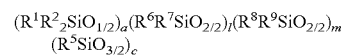
[Formula 4]

In Formula 4, $R^1$ is an alkyl group having 1 to 4 carbon atoms, $R^2$ is a monovalent hydrocarbon having at least 2 carbon atoms, $R^6$ is an aryl group having 6 to 25 carbon atoms, $R^7$, $R^8$, and $R^9$ are each independently an alkyl group having 1 to 20 carbon atoms, an alkenyl group having 2 to 20 carbon atoms, or an aryl group having 6 to 25 carbon atoms, $R^5$ is an alkyl group having 1 to 20 carbon atoms or an aryl group having 6 to 25 carbon atoms, at least one of $R^2$, $R^7$, $R^8$, and $R^9$ is an alkenyl group, and when a+l+m+c is set to 1, a is 0.01 to 0.10, l is 0 to 0.90, m is 0 to 0.90, and c is 0.01 to 0.30. Here, l and m are not simultaneously 0, (l+m)/a is 5 or more, and (l+m)/c is 5 or more.

In the average empirical formula of Formula 4, a, l, m, and c each refer to a molar ratio of a siloxane unit. Here, when the sum of (a+l+m+c) is set to be 1, a is 0.01 to 0.10, l is 0 to 0.90, m is 0 to 0.90, and c is 0.01 to 0.30.

In the average empirical formula of Formula 4, l and m are not simultaneously 0. In addition, in the average empirical formula of Formula 4, (l+m)/c may be 5 or more, 7 or more, 8 or more, or 10 or more. In addition, in the average empirical formula, (l+m)/a may be 5 or more, 8 or more, or 10 or more. Here, the upper limit of (l+m)/c may be, but is not particularly limited to, for example, 70, 60, 50, or 40. In addition, the upper limit of (l+m)/a may also be, but is not particularly limited to, for example, 110, 100, 90, 80, 70, or 60.

In addition, in the average empirical formula of Formula 4, l and m are not simultaneously 0. When l and m are not 0, l/m may be in the range from 0.4 to 2.0, 0.4 to 1.5, or 0.5 to 1.

In one example, the organopolysiloxane having the average empirical formula of Formula 3 or 4 may include a unit of Formula 5 or 6.

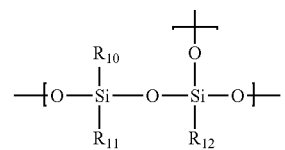
[Formula 5]

In Formula 5, $R_{10}$, $R_{11}$, and $R_{12}$ are each independently an alkyl group having 1 to 20 carbon atoms, an alkenyl group having 2 to 20 carbon atoms, or an aryl group having 6 to 25 carbon atoms, and at least one of $R_{10}$, $R_{11}$, and $R_{12}$ is an alkenyl group.

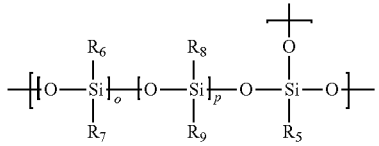

[Formula 6]

In Formula 6, $R_5$ is an alkyl group having 1 to 20 carbon atoms or an aryl group having 6 to 25 carbon atoms, $R_6$ is an aryl group having 6 to 25 carbon atoms, $R_7$, $R_8$, and $R_9$ are each independently an alkyl group having 1 to 20 carbon atoms, an alkenyl group having 2 to 20 carbon atoms, or an aryl group having 6 to 25 carbon atoms, and at least one of $R_7$, $R_8$, and $R_9$ is an alkenyl group.

In Formula 5, $R_{12}$ is an aryl group, for example, an aryl group having 6 to 25, 6 to 21, 6 to 18, or 6 to 13 carbon atoms, or a phenyl group.

An exemplary organopolysiloxane may include at least one of the unit of Formula 5 or 6. The unit of Formula 5 or 6 is a unit of a shape in which the silicon atom of the D unit and the silicon atom of the T unit are directly bound to each other by means of an oxygen atom. In one example, as described above, the organopolysiloxane is a mixture of at least two components, and includes at least one single component having the unit of Formula 5 or 6 even when an average of the compositions of each component is represented by the average empirical formula of Formula 3 or 4. The organopolysiloxane including the unit of Formula 5 or 6 may be manufactured by, for example, reacting a polysiloxane having a cage or partial cage structure with a cyclic siloxane compound which will be described below. Particularly, when the above-described method is applied, the organopolysiloxane in which the unit of Formula 5 or 6 is included, and the silicon atom to which an alkoxy group is bound and a silicon atom to which a hydroxyl group is bound are included in the structure in minimum amounts can be manufactured.

In one example, the organopolysiloxane having the average empirical formula of Formula 3 or 4 may have a ratio (OR/Ak) of an area (OR) of a peak derived from an alkoxy group binding to a silicon atom with respect to an area (Ak) released from an alkenyl group binding to a silicon atom in a spectrum obtained by $^1$H NMR of 0.05 or less, 0.03 or less, 0.01 or less, 0.005 or less, or 0. In this range, a suitable viscosity may be exhibited, and other physical properties may also be excellently maintained.

In addition, in one example, the organopolysiloxane having the average empirical formula of Formula 3 or 4 may have an acid value measured by KOH titration of 0.05 mgKOH/g or less, 0.03 mgKOH/g or less, 0.01 mgKOH/g or less, or 0 mgKOH/g. In this range, a suitable viscosity may be exhibited, and other physical properties may also be excellently maintained.

The organopolysiloxane of Formula 3 or 4 may be a reaction product of a mixture of a cyclic siloxane compound and the polysiloxane having a cage or partial cage structure. Here, as the cyclic siloxane compound, a compound represented by Formula 7 may be used. In addition, the polysiloxane having a cage structure may be a polysiloxane represented by an average empirical formula of Formula 8, and the polysiloxane having a partial cage structure may be a polysiloxane represented by an average empirical formula of Formula 9.

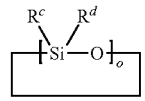

[Formula 7]

[Formula 8]

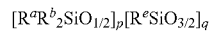

[Formula 9]

In Formulas 7 to 9, $R^a$ and $R^b$ are each independently a monovalent hydrocarbon group having at least two carbon atoms or an alkyl group having 1 to 4 carbon atoms, $R^c$ and $R^d$ are each independently an aryl group having 6 to 25 carbon atoms, an alkyl group having 1 to 20 carbon atoms, or a monovalent hydrocarbon group having at least two carbon atoms, $R^e$ is each independently a monovalent hydrocarbon group having at least two carbon atoms, o is 3 to 6, p is 1 to 2, and q is 3 to 10.

In Formulas 7 to 9, specific kinds of $R^a$, $R^c$, $R^d$, and $R^e$, specific values of o, p, and q, and a ratio of respective components in the mixture may be determined according to an organopolysiloxane having a desired structure.

By a reaction of the compound of Formula 7 with a mixture of the polysiloxane represented by the average empirical formula of Formula 8 and/or the polysiloxane represented by the average empirical formula of Formula 9, an organopolysiloxane having a desired structure, for example, the above-described partially-crosslinked structure may be synthesized at a sufficient molecular weight.

According to the reaction of such a mixture, the synthesized polysiloxane may have a functional group such as an alkoxy or hydroxyl group binding to a silicon atom at a minimum content, thereby preparing a desired product having excellent physical properties.

In one example, the mixture may further include a compound represented by Formula 10.

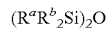 [Formula 10]

In Formula 10, $R^a$ is a monovalent hydrocarbon group having at least two carbon atoms, and $R^b$ is an alkyl group having 1 to 4 carbon atoms.

In Formula 10, specific examples of the monovalent hydrocarbon group and the alkyl group having 1 to 4 carbon atoms are described in the descriptions of Formula 1. In addition, in Formula 9, specific kinds of $R^a$ and $R^b$ and a mixing ratio of the mixture may be determined according to a desired structure of an organopolysiloxane.

In one example, the reaction of respective components in the mixture may be performed in the presence of a suitable catalyst. Therefore, the mixture may further include a catalyst.

As a catalyst capable of being included in the mixture, for example, a base catalyst may be used. A suitable base catalyst may be, but is not limited to, a metal hydroxide such as KOH, NaOH, or CsOH; a metal silanolate including an alkali metal compound and a siloxane; or a quaternary ammonium compound such as tetramethylammonium hydroxide, tetraethylammonium hydroxide, or tetrapropylammonium hydroxide.

A ratio of the catalyst in the mixture may be suitably selected in consideration of desired reactivity, and for example, may be 0.01 to 30 parts by weight, or 0.03 to 5 parts by weight with respect to 100 parts by weight of a total weight of the reaction products in the mixture. In the specification, unless specifically defined otherwise, units "parts by weight" refer to a weight ratio between components.

In one example, the reaction of the mixture may be performed in the presence of a suitable solvent. As a solvent, the reaction product in the mixture, that is, a disiloxane or polysiloxane, may be suitably mixed with a catalyst, and any kind of solvent that does not interfere with reactivity may be used. The solvent may be, but is not limited to, an aliphatic hydrocarbon-based solvent such as n-pentane, i-pentane, n-hexane, i-hexane, 2,2,4-trimethyl pentane, cyclohexane, or methylcyclohexane; an aromatic solvent such as benzene, toluene, xylene, trimethyl benzene, ethyl benzene, or methylethyl benzene; a ketone-based solvent such as methylethylketone, methylisobutylketone, diethylketone, methyl n-propyl ketone, methyl n-butyl ketone, cyclohexanone, methylcyclohexanone, or acetylacetone; an ether-based solvent such as tetrahydrofuran, 2-methyl tetrahydrofuran, ethyl ether, n-propyl ether, isopropyl ether, diglyme, dioxine, dimethyldioxine, ethyleneglycol monomethyl ether, ethyleneglycol dimethyl ether, ethyleneglycol diethyl ether, propyleneglycol monomethyl ether, or propyleneglycol dimethyl ether; an ester-based solvent such as diethyl carbonate, methyl acetate, ethyl acetate, ethyl lactate, ethyleneglycol monomethylether acetate, propyleneglycol monomethylether acetate, or ethyleneglycol diacetate; or an amide-based solvent such as N-methyl pyrrolidone, formamide, N-methyl formamide, N-ethyl formamide, N,N-dimethyl acetamide, or N,N-diethylacetamide.

The reaction may be performed by adding the catalyst to the reaction product. Here, a reaction temperature may be controlled within a range of, for example, 0° C. to 150° C., or 30° C. to 130° C. In addition, a reaction time may be controlled within a range of, for example, 1 hour to 3 days.

The composition for forming the first and/or second film layer(s) may include a silicone compound (B) having a hydrogen atom binding to a silicon atom. The silicone compound may have at least one or two hydrogen atoms.

The compound (B) may serve as a crosslinking agent crosslinking the component (A), and particularly, crosslinking and curing may progress by performing an addition reaction of the hydrogen atom of the compound (B) and an alkenyl group of the component (A).

As the compound (B), various kinds including a hydrogen atom (Si—H) binding to a silicon atom in a molecule may be used. There is no limitation to a molecular structure of the compound (B), and any one capable of being used as a crosslinking agent in a conventional addition-reactive composition may be used. The compound (B) is a linear, branched, cyclic, or crosslinked organopolysiloxane. The compound (B) may be a compound having 2 to 1000 or 3 to 300 silicon atoms in one molecule.

In one example, as the compound (B), an organopolysiloxane having an average unit of Formula 11 may be used.

  [Formula 11]

In Formula 11, Q is an epoxy group or a monovalent hydrocarbon group, and c and d are numbers such that c+d is 1 to 2.8 and c/(c+d) is 0.001 to 0.34.

In one example, a molar ratio (H/Si) of a hydrogen atom (H) binding to a silicon atom with respect to total silicon atoms (Si) included in the compound (B) or the organopolysiloxane of Formula 11 may be 0.2 to 0.8 or 0.3 to 0.75. As the molar ratio is controlled to 0.2 or more, curability of the composition may be excellently maintained, and as the molar ratio is controlled to 0.8 or less, crack resistance and thermal and shock resistance may be excellently maintained.

In addition, the compound (B) or the organopolysiloxane of the average unit of Formula 11 may include at least one aryl group, and therefore, at least one of Q in Formula 11 may be an aryl group. Accordingly, a refractive index and hardness of the cured product may be effectively controlled. The aryl group may be present in such an amount that a molar ratio (Ar/Si) of the aryl group (Ar) with respect to total silicon atoms (Si) included in the compound (B) or the organopolysiloxane of Formula 11 is 0.3 to 1.5 or 0.4 to 1.2. As the molar ratio (Ar/Si) is controlled to 0.3 to 1.5, the physical properties of the cured composition may be suitably maintained.

The compound (B) or the organopolysiloxane of the average unit of Formula 11 may have a viscosity at 25° C. of 0.1 cp to 100,000 cp, 0.1 cp to 10,000 cp, 0.1 cp to 1,000 cp, or 0.1 cp to 300 cP. As the compound (B) or the organopolysiloxane of the average unit of Formula 11 has the above viscosity, processability of the composition may be excellently maintained.

The compound (B) or the organopolysiloxane of the average unit of Formula 11 may have a molecular weight of, for example, less than 1,000 or 800. When the molecular weight is 1,000 or more, strength of the cured product may be degraded. The lower limit of the molecular weight of the compound (B) or the organopolysiloxane having the average unit of Formula 11 is not particularly limited, and may be, for example, 250. In the compound (B) or the organopolysiloxane having the average unit of Formula 11, the molecular weight may refer to a weight average molecular weight, or a conventional molecular weight of the compound.

In one example, the compound (B) may be a compound represented by Formula 12.

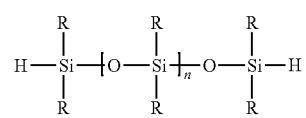  [Formula 12]

In Formula 12, R is each independently hydrogen, an alkoxy group, a hydroxyl group, an epoxy group, an acryloyl group, a methacryloyl group, an isocyanate group, or a monovalent hydrocarbon group, and n is 1 to 100.

Both ends of a molecular chain of the compound of Formula 12 may be blocked by a hydrogen atom binding to a silicon atom. When needed, at least one of Rs present at side chains of the molecule of Formula 12 may also be a hydrogen atom.

In Formula 12, n is 1 to 100, 1 to 50, 1 to 25, 1 to 10, 1 to 5, 1 to 3, or 1 to 2, and thus strength and crack resistance of a cured product may be excellently maintained.

A method of preparing the compound (B) is not particularly limited, and for example, a conventionally known method of preparing a polysiloxane compound, or a similar method of preparing the compound (A) may be used.

In one example, a content of the compound (B) may be selected in such a range that a molar ratio (H/Ak) of a hydrogen atom (H) binding to a silicon atom included in the compound (B) with respect to total alkenyl groups (Ak) included in the organopolysiloxane (A) is 0.8 to 1.2, 0.85 to 1.15, or 0.9 to 1.1. The content of the compound (B) may be, for example, 50 to 500 or 50 to 400 parts by weight with respect to 100 parts by weight of the compound (A).

In one example, the first film layer may include at least one aryl group binding to a silicon atom. Accordingly, the compound (A) or (B) of the composition for forming the first film layer may include the aryl group. In the first film layer, for example, a molar ratio (Ar/Si) of the aryl group (Ar) with respect to total silicon atoms (Si) included in the first film layer is 0.3 or more, 0.35 or more, or 0.4 or more. In such a range, the LED may stably ensure long-term reliability and brightness. The upper limit of the molar ratio (Ar/Si) may be, but is not particularly limited to, for example, 2.0, 1.5, or 1.2.

In one example, the first film layer may include an epoxy group binding to a silicon atom. Accordingly, the compound (A) or (B) of the composition for forming the first film layer may include the epoxy group. In the first film layer, for example, a molar ratio (E/Si) of the epoxy group (E) with respect to total silicon atoms (Si) of the first film layer may be 0.001 to 0.15 or 0.005 to 0.1. In such a range, an adhesive property of the film layer to the LED chip or the long-term reliability of the diode may be stably ensured.

The curable composition for forming the first and/or second film layer may further include a hydrosilylation catalyst. The hydrosilylation catalyst may be used to stimulate a reaction between an alkenyl group of the above-described organopolysiloxane (A) and a hydrogen atom binding to a silicon atom of the compound (B). As a hydrosilylation catalyst, all conventional components known in the art may be used. As such a catalyst, a platinum-, palladium-, or rhodium-based catalyst may be used. In the specification, a platinum-based catalyst may be used in consideration of catalyst efficiency, and may be, but is not limited to, chloroplatinic acid, platinum tetrachloride, an olefin complex of platinum, an alkenyl siloxane complex of platinum, or a carbonyl complex of platinum.

A content of the hydrosilylation catalyst is not particularly limited as long as the hydrosilylation catalyst is included at a catalytic amount, that is, an amount capable of serving as a catalyst. Conventionally, the hydrosilylation catalyst may be used at 0.1 to 500 ppm or 0.2 to 100 ppm based on an atomic weight of platinum, palladium, or rhodium.

The first film layer may include a high refractive filler, and thus the composition for forming the first film layer may further include, for example, a high refractive filler. The term "high refractive filler" refers to a filler having a refractive index with respect to light with a wavelength of 400 nm of 1.55 or more. The refractive index of the first film layer may be effectively controlled using such a high refractive filler. The upper limit of the refractive index of the high refractive filler is not particularly limited, and may be controlled within a suitable range in consideration of a desired refractive index of the film layer.

A kind of the high refractive filler is not particularly limited as long as it has the above-described refractive index, and may be one or at least two selected from the group consisting of titanium oxide, zirconium oxide, cerium oxide, hafnium oxide, niobium pentoxide, tantalum pentoxide, indium oxide, tin oxide, indium tin oxide, zinc oxide, silicon, zinc sulfide, calcium carbonate, barium sulfate, and magnesium oxide.

A ratio or particle size of the high refractive filler in the curable composition for forming the first film layer is not particularly limited, and may be suitably selected within a suitable range in consideration of, for example, the refractive index of the desired first film layer.

The first film layer may include scattering particles, and thus the composition for forming the first film layer may further include scattering particles when needed. The term "scattering particles" used herein may refer to, for example, particles having a refractive index different from that of to a surrounding environment, for example, the first film layer excluding the scattering particles and a suitable size, and thus scattering, refracting, or diffusing incident light. For example, the scattering particles may have a refractive index lower or higher than that of the first film layer excluding the scattering particles. For example, the scattering particles may have an absolute value of the difference in refractive index with the first film layer excluding the scattering particles of approximately 1.0 or less, 0.9 or less, 0.8 or less, or 0.7 or less. The difference in refractive index may be, for example, approximately 0.15 or more, 0.2 or more, or approximately 0.4 or more. In addition, the scattering particles may have an average particle diameter of, for example, 100 nm or more or 200 nm or more. The average particle diameter of the scattering particles may be 20,000 nm or less, 15,000 nm or less, 10,000 nm or less, 5,000 nm or less, 1,000 nm or less, or 500 nm or less. The scattering particles may have a circular, oval, polygonal, or amorphous shape, and the shape thereof is not particularly limited thereto. The scattering particles may include, for example, an organic material such as polystyrene or a derivative thereof, an acryl resin or a derivative thereof, a silicone resin or a derivative thereof, or a novolac resin or a derivative thereof, or an inorganic material such as silica, alumina, titanium oxide, or zirconium oxide. The scattering particles may include any one of the above-described materials or at least two thereof. For example, as the scattering particles, particles formed in hollow particles such as hollow silica or core/shell-type particles may be used.

Such scattering particles may be included at approximately 0.1 wt % to 30 wt % or approximately 0.5 wt % to 10 wt % in the first film layer, and in such a ratio, suitable scattering characteristics may be ensured.

The second film layer may include a phosphor, and thus the composition for forming the second film layer may further include a phosphor. As the phosphor, a known phosphor may be used without particular limitation, and for example, in consideration of a purpose, a conventionally known silicate-based phosphor, a nitride-based phosphor, or an yttrium aluminum garnet (YAG) may be used.

A ratio of the phosphor may be controlled as needed, and for example, the phosphor may be included at approximately 5 wt % or more, 10 wt % or more, 20 wt % or more, 30 wt % or more, 40 wt % or more, or 50 wt % or more in the second film layer. The phosphor may be further included at approximately 90 wt % or less, 80 wt % or less, or 70 wt % or less in the second film layer.

When needed, the first film layer may also include a phosphor, and thus the composition for forming the first film layer may further include a phosphor. In this case, a kind of the phosphor used herein and a ratio of the phosphor in the first film layer are not particularly limited, and, for example, those described in the second film layer may be applied.

The first film layer and/or the second film layer may further include an inorganic filler, for example, the above-described high refractive filler or an inorganic filler excluding scattering particles or a phosphor, and thus the composition(s) for forming the first and/or second film layer may include the inorganic filler.

In this case, the kind and ratio of the inorganic filler used herein are not particularly limited, and may be suitably selected according to a purpose of the inorganic filler.

The curable composition for forming the first and/or second film layer may further include a tackifier in an aspect of additional enhancement of an adhesive property. The tackifier is a component capable of improving a self adhesive property to the composition or cured product, which may particularly improve a self-adhesive property to a metal and an organic resin.

The tackifier may be, but is not limited to, a silane having at least one or preferably two functional groups selected from the group consisting of an alkenyl group such as a vinyl group, a (meth)acryloyloxy group, a hydrosilyl group (SiH group), an epoxy group, an alkoxy group, an alkoxysilyl group, a carbonyl group, and a phenyl group; or an organic silicone compound such as a cyclic or linear siloxane having 2 to 30 or preferably 4 to 20 silicon atoms. In the specification, one or a mixture of at least two thereof may be used.

When the tackifier is included in the composition, the content thereof may be suitably changed in consideration of a desired effect for improving the adhesive property.

The curable composition for forming the first and/or second film layer may further include one or at least two of additives including a reaction inhibitor such as 2-methyl-3-butyne-2-ol, 2-phenyl-3-1-butyne-2-ol, 3-methyl-3-pentene-1-yne, 3,5-dimethyl-3-hexene-1-yne, 1,3,5,7-tetramethyl-1, 3,5,7-tetrahexenylcyclotetrasiloxane, or ethynylcyclohexane; an inorganic filler such as silica, alumina, zirconia or titania; a carbon-functional silane having an epoxy group and/or alkoxysilyl group, a partial hydrolysis-condensation product thereof, or a siloxane compound; a thixotropic agent such as fumed silica capable of being used in combination with polyether; a conductivity providing agent such as metal powder of silver, copper, or aluminum or various carbon materials; or a color adjusting agent such as a pigment or dye, when needed.

A method of manufacturing the LED using the above-described curable composition is not particularly limited, and for example, a method of sequentially coating and curing each curable composition on the LED chip, or forming each curable composition on a film and then sequentially transferring the composition onto the LED chip.

For example, the manufacturing method may include transferring the first silicone film on the LED chip, and transferring the second silicone film on the first silicone film.

Here, the method of forming the first and/or second silicone film is not particularly limited. For example, after the above-described curable composition for forming each film is coated on a support having a suitable releasable surface in consideration of a desired thickness, if needed, the coating layer may be dried, semi-cured, or completely-cured. For example, while the coating layer for forming the first and second film layer is dried or suitably semi-cured, first, the first film layer is transferred to the LED chip and maintained at a suitable temperature. In addition, the second film layer is transferred thereon, and completely cured.

Drying, semi-curing, or curing conditions applied in the process are not particularly limited, and may be changed in consideration of a composition ratio of the composition used herein.

Another aspect of the present invention provides a use of the LED. The LED may be effectively applied to, for example, backlights for liquid crystal displays (LCDs), lighting apparatuses, various kinds of sensors, light sources of a printer and a copy machine, light sources for a mobile gauge, signal lights, pilot lights, display devices, light sources of planar-type light emitting diodes, displays, decorations, or various kinds of lightings.

BRIEF DESCRIPTION OF THE DRAWINGS

FIG. 1 is a diagram of a structure of an exemplary LED.

DESCRIPTION OF REFERENCE NUMERALS

101: LED chip
102: first silicone film layer
103: second silicone film layer

EFFECTS

A light emitting diode having excellent initial light flux and excellent color uniformity and dispersion, a method of manufacturing the same, and a use thereof can be provided.

DETAILED DESCRIPTION OF EXEMPLARY EMBODIMENTS

Hereinafter, exemplary embodiments of the present invention will be described in detail. However, the present invention is not limited to the embodiments disclosed below, but can be implemented in various forms. The following embodiments are described in order to enable those of ordinary skill in the related art to embody and practice the present invention.

Hereinafter, the abbreviations "Vi," "Ph," "Me," and "Ep" refer to a vinyl group, a phenyl group, a methyl group, and a 3-glycidoxypropyl group.

1. Measurement of Optical Characteristics

Optical characteristics (color uniformity, color dispersion, and initial light flux) were measured using an integration sphere (Otsuka, LE-3400) by applying a current to an LED package manufactured in Example or Comparative Example.

Example 1

Formation of First Silicone Film

A curable composition was prepared by mixing organopolysiloxanes represented by Formulas A to C (blending amount: 20 g of Formula A, 60 g of Formula B, and 18 g of Formula C), blending a catalyst (platinum(0)-1,3-divinyl-1, 1,3,3-tetramethyldisiloxane) at a content of Pt(0) of 2 ppm, and curing the resulting mixture to have a refractive index with respect to a wavelength of 400 nm of approximately 1.56. A first silicone film was formed by preparing a coating composition by mixing approximately 10 g of alumina having an average particle diameter of approximately 10 nm with 98 g of the curable composition, and coating the coating composition on an ethylene tetrafluoroethylene (ETFE) film to have a final thickness of approximately 10 nm, and maintaining the resulting film at 80° C. for 5 minutes.

  [Formula A]

  [Formula B]

  [Formula C]

Formation of Second Silicone Film

A curable composition was prepared by mixing organopolysiloxanes represented by Formulas C to E (blending amount: 20 g of Formula D, 60 g of Formula E, and 18 g of Formula C), blending a catalyst (platinum(0)-1,3-divinyl-1,1,3,3-tetramethyldisiloxane) at a content of Pt(0) of 2 ppm, and curing the resulting mixture to have a final refractive index of approximately 1.49. A second silicone film was formed by preparing a coating composition by mixing 200 g of a YAG as a phosphor and approximately 3 g of silica having an average particle diameter of approximately 10 nm with 98 g of the curable composition, and coating the coating composition on an ETFE (ethylene tetrafluoroethylene) film to have a final thickness of approximately 100 nm as described in the formation of the first silicone film, and maintaining the resulting film at 80° C. for 5 minutes.

$(ViMe_2SiO_{1/2})_2(Me_2SiO_{2/2})_{20}(Ph_2SiO_{2/2})_{10}$ [Formula D]

$(ViMe_2SiO_{1/2})_2(Me_2SiO_{2/2})_1(EpMeSiO_{2/2})_{0.2}(PhSiO_{3/2})_4(SiO_{4/2})_{0.5}$ [Formula E]

$(HMe_2SiO_{1/2})_2(Ph_2SiO_{2/2})$ [Formula C]

Manufacture of LED Package

Each manufactured film was cut into a suitable size, a first silicone film was transferred to an LED chip (an LED chip for a 3535 LED package manufactured of polyphthalamide (PPA)), a fluorine resin film was removed, and then the resulting product was maintained at 150° C. for 5 minutes. Subsequently, a second silicone film was transferred onto the first silicone film as described above, a fluorine resin film was removed, and the resulting product was maintained at 150° C. for 4 hours to cure. Here, during the transfer of the silicone film, a gold wire contacting the LED and an external contact terminal was coated. Subsequently, a transparent silicone resin generally applied as an encapsulant was injected into a reflector, and maintained at 150° C. for 4 hours, thereby manufacturing an LED package.

Example 2

An LED package was manufactured by the same method as described in Example 1, except that a coating solution prepared by blending 98 g of the curable composition, which was the same as being used to form the first silicone film of Example 1 10 g of alumina particles having an average particle diameter of approximately 10 nm, and 200 g of a phosphor (YAG), was used to form a first silicone film.

Example 3

An LED package was manufactured by the same method as described in Example 1, except that a coating solution prepared by blending 98 g of the curable composition, which was the same as being used to form the first silicone film of Example 1, and 200 g of a phosphor (YAG), was used to form a first silicone film, and a coating solution prepared by blending 98 g of the curable composition, which was the same as being used to form the second silicone film of Example 1, and 200 g of a phosphor (YAG), was used to form a second silicone film.

Example 4

An LED package was manufactured by the same method as described in Example 1, except that a coating solution prepared by blending 98 g of the curable composition, which was the same as being used to form the first silicone film of Example 1, 200 g of a phosphor (YAG), and approximately 3 g of titanium oxide particles as scattering particles having a refractive index of approximately 1.63 and an average particle diameter of approximately 100 nm, was used to form a first silicone film.

Comparative Example 1

An LED package was manufactured by the same method as described in Example 1, except that a coating solution prepared by blending 5 g of a phosphor (YAG) with 100 g of the curable composition which was the same as being used in formation of a second silicone film in Example 1 was dispensed on a reflector to cover an entire surface of a diode and maintained at 150° C. for 4 hours, which was equal to conventionally form an encapsulant of the LED package. The LED chip used in this process was the same as that used in Example 1.

Comparative Example 2

An LED package was manufactured as described in Example 1, except that a first silicone film was not formed and only a second silicone film was transferred to an LED chip.

Comparative Example 3

An LED package was manufactured as described in Example 1, except that a first silicone film layer was formed, a coating solution prepared by dispersing a phosphor (YAG) in a toluene was coated on the first silicone film layer and baked at 150° C. to form a phosphor layer, but a second silicone film layer was not formed.

Results of measuring physical properties of the curable compositions in Examples and Comparative Examples were summarized and listed in Table 1.

TABLE 1

| | Color uniformity (u') | Color dispersion (Cx) | Initial light flux (lm/W) |
|---|---|---|---|
| Example 1 | 0.001 | 0.001 | 93 |
| Example 2 | 0.001 | 0.001 | 92 |
| Example 3 | 0.001 | 0.001 | 90 |
| Example 4 | 0.001 | 0.001 | 94 |
| Comparative Example 1 | 0.008 | 0.005 | 83 |
| Comparative Example 2 | 0.001 | 0.001 | 85 |
| Comparative Example 3 | 0.010 | 0.008 | 79 |

What is claimed is:

1. A light emitting diode, comprising:
   an light emitting diode chip;
   a first silicone film layer comprising a phosphor formed on the light emitting diode chip; and
   a second silicone film layer formed on the first silicone film layer, comprising a phosphor, and having a refractive index lower than that of the first silicone film layer while excluding the phosphor,
   wherein the first silicone film layer comprises an aryl group binding to a silicon atom,
   wherein the first silicone resin film layer comprises a filler having a refractive index with respect to light with a wavelength of 400 nm of 1.55 or more.

2. The light emitting diode according to claim 1, wherein the first silicone film layer has a refractive index with respect to light with a wavelength of 400 nm of 1.5 or more.

3. The light emitting diode according to claim 1, wherein the second silicone film layer has a refractive index with respect to light with a wavelength of 400 nm of 1.6 or less while excluding a phosphor.

4. The light emitting diode according to claim 1, wherein the first or second silicone film layer is a cured film layer of a composition including an organopolysiloxane having an average unit of Formula 1 and an organopolysiloxane having an average unit of Formula 11:

$$P_a Q_b SiO_{(4-a-b)/2}$$ [Formula 1]

$$H_c Q_d SiO_{(4-c-d)/2}$$ [Formula 11]

where P is an alkenyl group, Q is an epoxy group or a monovalent hydrocarbon group, a+b is in a range of 0.8 to 2.2, and a/(a+b) is a number within a range of 0.001 to 0.15, and c and d are numbers such that c+d is 1 to 2.8 and c/(c+d) is 0.001 to 0.34.

5. The light emitting diode according to claim 1, wherein the first silicone film layer comprises an epoxy group binding to a silicon atom.

6. The light emitting diode according to claim 5, wherein a ratio (E/Si) of a mole of an epoxy group (E) with respect to a mole of total silicon atoms (Si) included in the first silicone film is 0.001 to 0.15.

7. The light emitting diode according to claim 1, wherein the first silicone film layer comprises scattering particles.

8. The light emitting diode according to claim 7, wherein the scattering particles have an average particle diameter of 100 nm or more, and an absolute value of a difference in refractive index from that of the first silicone film layer excluding the scattering particles of 0.15 to 1.0.

9. The light emitting diode according to claim 1, wherein a weight ratio of the scattering particles in the first silicone film layer is 0.1 wt % to 30 wt %.

10. A liquid crystal display, comprising the light emitting diode of claim 1.

11. A light apparatus, comprising the light emitting diode of claim 1.

12. A method of manufacturing a light emitting diode, comprising:
transferring a first silicone film comprising a phosphor onto an light emitting diode chip; and
transferring a second silicone film comprising a phosphor and having a refractive index lower than that of the first silicone film while excluding the phosphor, onto the first silicone film,
wherein the first silicone film layer comprises an aryl group binding to a silicon atom,
wherein the first silicone resin film layer comprises a filler having a refractive index with respect to light with a wavelength of 400 nm of 1.55 or more.

* * * * *